United States Patent [19]

Sato et al.

[11] Patent Number: 4,891,727
[45] Date of Patent: Jan. 2, 1990

[54] MEMORY DEVICE

[75] Inventors: Tadashi Sato; Keiichi Nishikasa; Masayoshi Kamo, all of Kanagawa, Japan

[73] Assignee: Mitsubishi Denki K.K., Tokyo, Japan

[21] Appl. No.: 231,836

[22] PCT Filed: Dec. 18, 1987

[86] PCT No.: PCT/JP87/00988
§ 371 Date: Jun. 15, 1988
§ 102(e) Date: Jun. 15, 1988

[87] PCT Pub. No.: WO88/04803
PCT Pub. Date: Jun. 30, 1988

[30] Foreign Application Priority Data

Dec. 18, 1986 [JP] Japan .................... 61-302579

[51] Int. Cl.⁴ .................. G11B 17/02; G11B 5/02; G06K 7/00
[52] U.S. Cl. .................. 360/137; 235/440; 365/244; 369/292
[58] Field of Search .............. 360/137, 69, 97.01; 365/244, 52; 235/440; 369/292

[56] References Cited

FOREIGN PATENT DOCUMENTS 59-136860 8/1984 Japan .
61-20185 1/1986 Japan .

OTHER PUBLICATIONS

"3.5" Floppy Disk Drivers Thinner Than 32 mm" Nikkei Electronics, 1986.5.5 (no. 404), pp. 123–142.

Primary Examiner—Robert S. Tupper
Attorney, Agent, or Firm—Kanesaka & Takeuchi

[57] ABSTRACT

In order that either a disk cartridge 3 housing a disk memory medium 2, such as a flexible magnetic sheet, which is mechanically accessible or a semiconductor cartridge 15A (or 15B) housing a semiconductor memory medium which is statically accessible without any mechanical movement is made usable in a memory device, the memory device is provided with a switching circuit 18 for switching between the disk and semiconductor memory medium control circuits 14 and 16; a discrimination circuit 17 for identifying the type of a memory medium of an inserted disk cartridge; and a device for feeding an output of the discrimination circuit 17 to the switching circuit 18 for effecting automatic switching or a selecting device 29 for controlling the switching circuit 18 according to the memory medium to be used.

12 Claims, 14 Drawing Sheets

FIG. 1 PRIOR ART

PRIOR ART

MEMORY DEVICE

TECHNICAL FIELD

The present invention relates to memory devices such as flexible magnetic disk devices in which an external memory medium such as a flexible magnetic disk is mounted.

BACKGROUND ART

Figure 1:
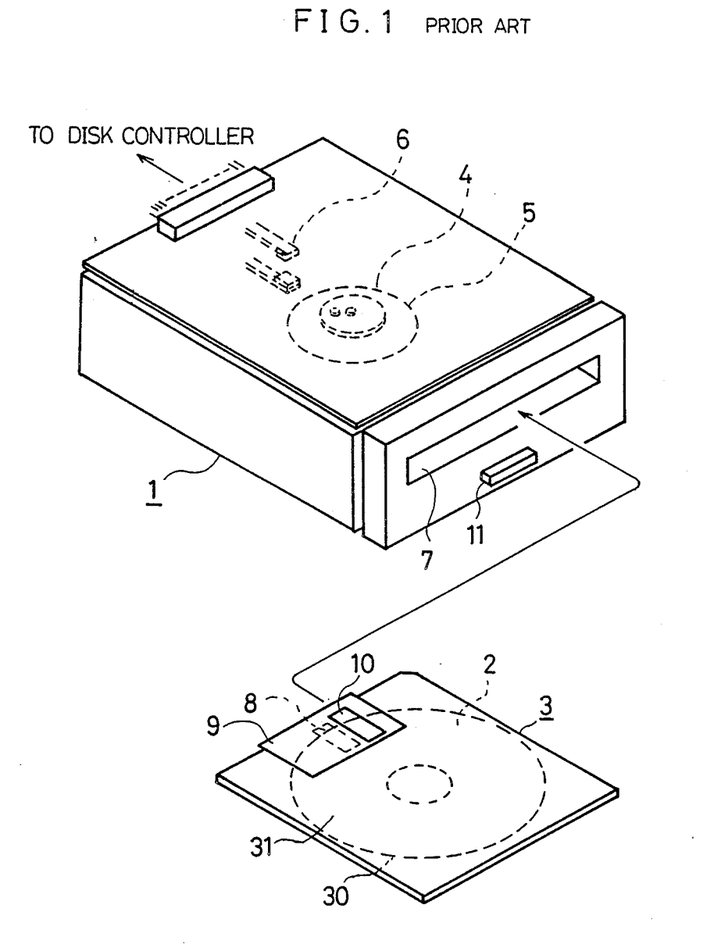
FIG. 1 is a perspective view of a conventional disk device.

FIG. 1 shows a conventional flexible magnetic disk device (hereinafter "disk device") employing a flexible magnetic sheet (hereinafter "disk sheet") such as shown in NIKKEI ELECTRONICS, 1986, 5-5 (No. 394), pp. 123-142, published by the Nikkei McGraw-Hill Co. in Japan. A disk cartridge 3 has a pair of sides 30 (side 0) and 31 (side 1) and houses a disk sheet 2 therebetween. The disk device 1 includes a chucking hub 4 for holding the disk sheet 2, a spindle motor 5 for rotating the disk sheet 2 via the chucking hub 4, a magnetic head 6 for writing or reading information from the disk sheet 2, a slot 7 for receiving the disk cartridge 3, a head slot 8 for allowing the magnetic head 6 to access the disk sheet 2, a shutter 9 for exposing the head slot 8 only when the disk cartridge 3 is inserted through the slot 7, a window 10 provided on the shutter 9 for the head slot 8, and an eject button 11 for removing the disk cartridge 3.

When the disk cartridge 3 is inserted through the slot 7, the shutter 9 is opened by a shutter opening mechanism (not shown) so that the magnetic head 6 may be brought into contact with the disk sheet 2 by a magnetic head loading mechanism (not shown). When the eject button 11 is pressed, the magnetic head loading and shutter opening mechanisms are controlled by an eject mechanism (not shown) so that the disk cartridge 3 may be removed with the shutter 9 closed.9 closed.

FIGS.

Figure 2A:
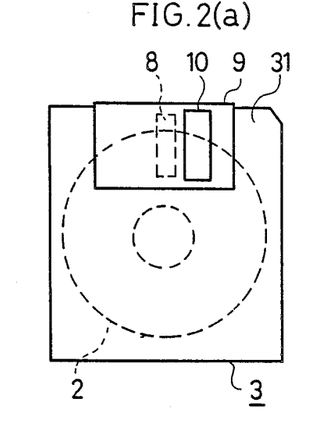
FIGS. 2(a) through 2(d) are plan views of a conventional disk cartridge.
Figure 2B:
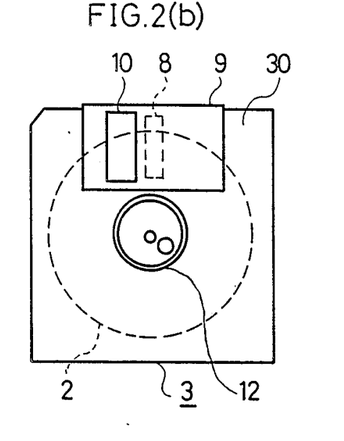
Figure 2C:
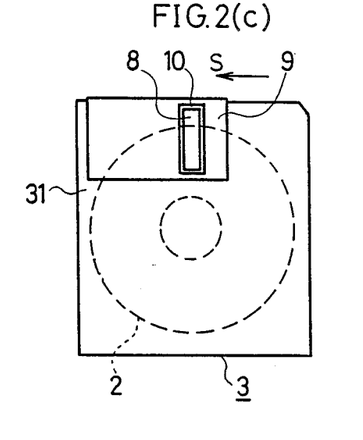
Figure 2D:
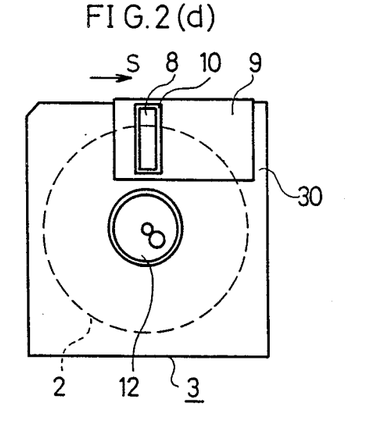

FIGS. 2(a) through 2(d) show the movement of the shutter 9 when the disk cartridge 3 is mounted in the drive. A chucking plate 12 is adapted to engage the chucking hub 4 to hold the disk sheet 2. As shown in FIGS. 2(a and 2(b), the shutter 9 is closed by a shutter spring (not shown) mounted within the disk cartridge 3 before the cartridge 3 is mounted in the drive 1. As shown in FIGS. 2(c) and 2(d), when the cartridge 3 is inserted into the drive 1, the shutter 9 is opened in the direction of an arrow S so that the magnetic head 6 may access the disk sheet 2 through the head slot 8.

Figure 3A:
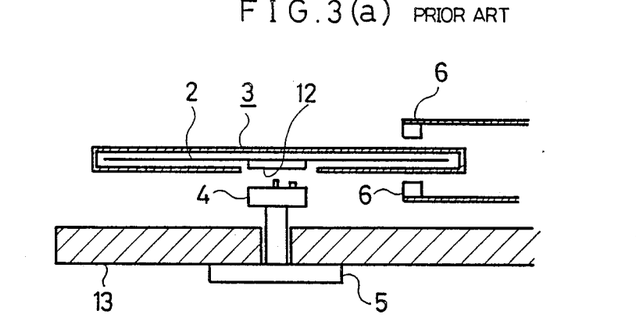
FIGS. 3(a) and 3(b) are sectional views of the disk device of FIG. 1.
Figure 3B:
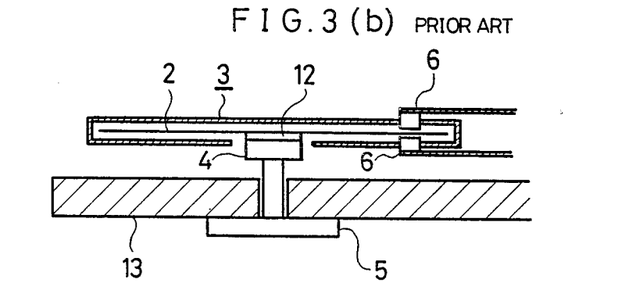

FIGS. 3(a) and 3(b) are sectional views of the disk drive 1, in which the spindle motor 5 is fixed on a base 13. As shown in FIG. 3(a), when the disk cartridge 3 is inserted through the slot 7, the chucking plate 12 is placed at a position opposed to the chucking hub 4. As shown in FIG. 3(b), the disk cartridge 3 is then depressed by a disk cartridge loading mechanism (not shown) to bring the chucking plate 12 into contact with the chucking hub 4 so that the magnetic head 6 may be brought into contact with the disk sheet 2 by the magnetic head loading mechanism. The spindle motor 5 then rotates the disk sheet 2 for allowing the magnetic head 6 to write or read information therefrom.

Figure 4:
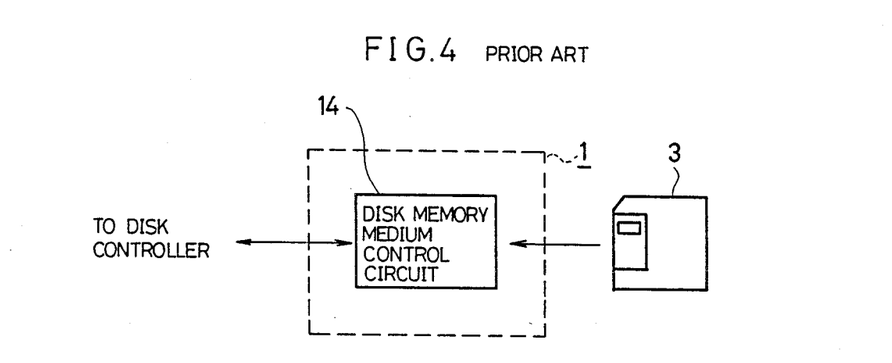
FIG. 4 is a block diagram of the conventional disk device.

FIG. 4 is a block diagram of the conventional disk device. A disk memory medium control circuit 14 controls the rotation of the spindle motor 5, the positioning of the magnetic head 6, and the writing and reading of information from the disk sheet 2 and exchanges information with an external device such as a disk controller (not shown).

As has been described above, the conventional disk devices use a disk sheet which requires mechanical movements such as rotation and positioning for the writing or reading of information. To access the disk sheet, it is necessary to move the magnetic head to the target track and hold it until the target sector on the track is rotated to the magnetic head position. Thus, the writing or reading of information takes a considerable amount of time, and these disk devices are unable to use in a system which requires a shorter access time than the above. Disclosure of the Invention Accordingly, it is an object of the invention to provide a disk device which is able to use a semiconductor memory medium, such as an IC memory, which is statically accessible at a short time without any mechanical movement.

According to an aspect of the invention there is provided a memory device which includes a memory medium holding device for holding either a disk cartridge housing a disk memory medium which is mechanically accessible or a semiconductor cartridge housing a semiconductor memory medium which is statically accessible; a disk memory medium control circuit for controlling the disk memory medium; a semiconductor memory medium control circuit for controlling the semiconductor memory medium; a discrimination device for discriminating the type of a memory medium of an inserted cartridge; and a switching circuit responsive to an output of the discrimination device to select either the disk memory medium control circuit or the semiconductor memory medium control circuit.

According to another aspect of the invention there is provided a memory device which includes a memory medium holding device for holding either a disk cartridge housing a disk memory medium which is mechanically accessible or a semiconductor cartridge housing a semiconductor memory medium which is statically accessible; a disk memory medium control circuit for controlling the disk memory medium; a semiconductor memory medium control circuit for controlling said semiconductor memory medium; a switching circuit for switching between the semiconductor and disk memory medium control circuits; and a selection device for instructing the switching device to select either the disk memory medium control circuit or the semiconductor memory medium control circuit for operation.

DESCRIPTION OF THE PREFERRED EMBODIMENT

Figure 5:
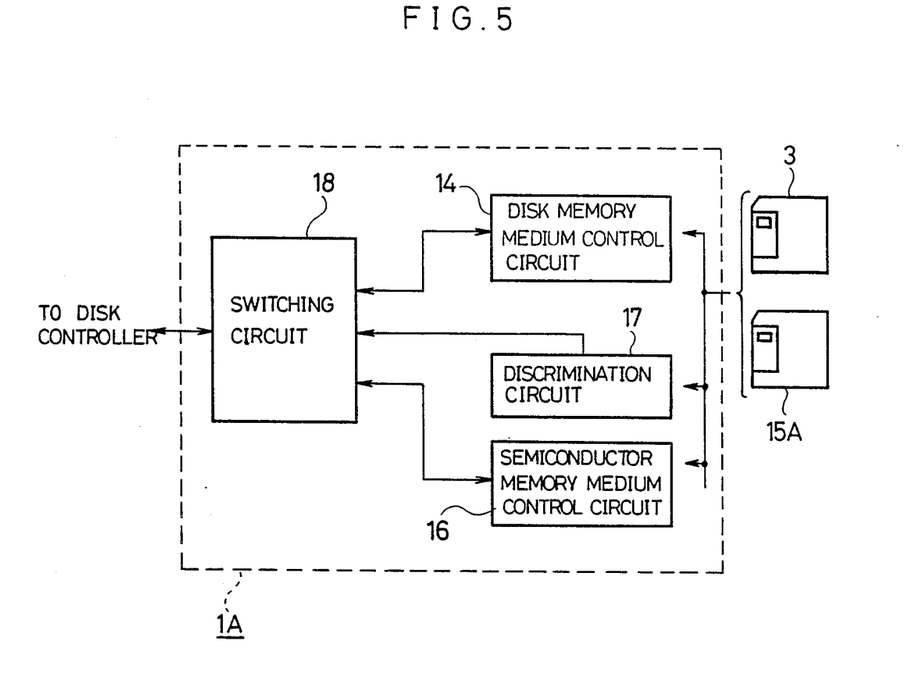
FIG. 5 is a block diagram of a disk device according to an embodiment of the invention.

In FIG. 5, there are shown a disk cartridge 3 which houses a conventional disk sheet 2 (not shown), a semiconductor cartridge 15A which houses a semiconductor memory medium such as an IC memory, and a disk device 1A which includes a conventional disk memory medium control circuit 14, a semiconductor memory medium control circuit 16 for controlling the semiconductor cartridge 15A, a discrimination circuit 17 for discriminating the type of an inserted memory medium, and a switching circuit 18 responsive to the discrimination output of the discrimination circuit 17 to select either the semiconductor memory medium control circuit 16 or the disk memory medium control circuit 14.

In operation, the discrimination circuit 17 discriminates the type of an inserted memory medium by reading a special device provided on the semiconductor cartridge 15A. When the discrimination circuit 17 recognizes the semiconductor cartridge 15A, the switching circuit 18 turns on the semiconductor memory medium control circuit 16, whereas when the discrimination circuit 17 does not recognize any semiconductor cartridge, the switching circuit 18 turns on the disk memory medium control circuit 14.

Figure 6:
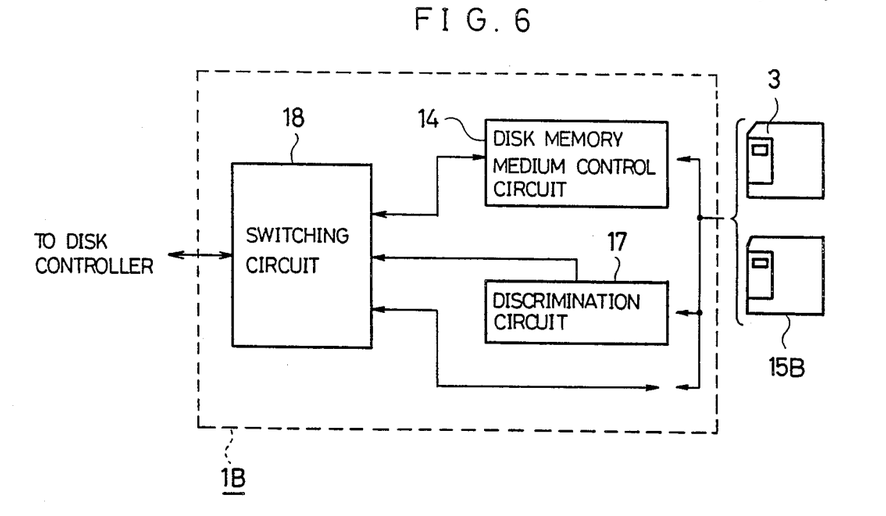
FIG. 6 is a block diagram of a disk device according to another embodiment of the invention.

FIG. 6 shows a disk device 1B according to another embodiment of the invention. A semiconductor cartridge 15B houses the semiconductor memory medium control circuit 16 as well as a semiconductor memory medium such as an IC memory. The operation of the disk device 1B is the same as that of the disk device 1A in FIG. 5 except that the semiconductor memory medium control circuit 16 is housed within the semiconductor cartridge 15A.

Figure 7A:
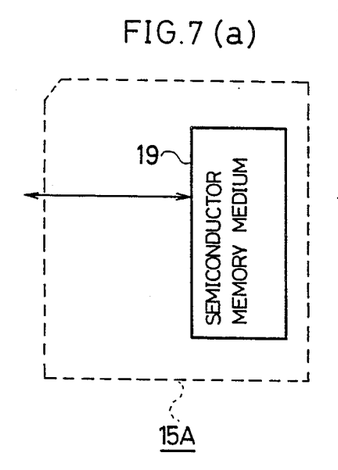
FIGS. 7(a) and 7(b) are block diagrams of a semiconductor cartridge useful for the invention.
Figure 7B:
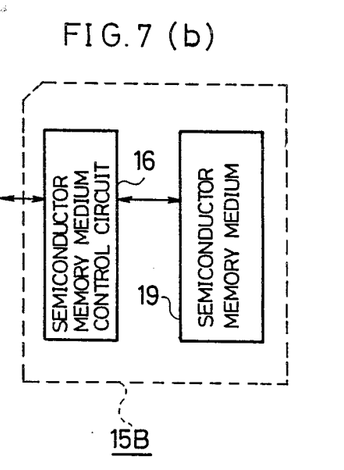

FIGS. 7(a) and 7(b) show the two types of semiconductor cartridges 15A and 15B useful for the respective disk devices 1A and 1B. It is shown that each cartridge houses the semiconductor memory medium 19 such as an IC memory.

FIGS. 8(a) through 8(d) show a semiconductor cartridge useful for the above embodiments. The semiconductor cartridge 15A (or 15B) has a number of conductors 20 printed on surface of the cartridge 15A for making an electrical connection with the disk device 1A (or 1B) and a discrimination hole 21 provided on the semiconductor cartridge 15A.

Figure 8A:
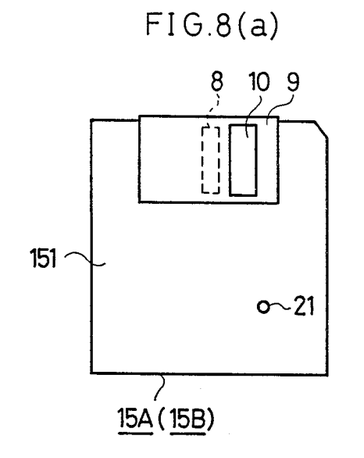
FIGS. 8(a) through 8(d) are plan views of a semiconductor cartridge useful for the invention.
Figure 8B:
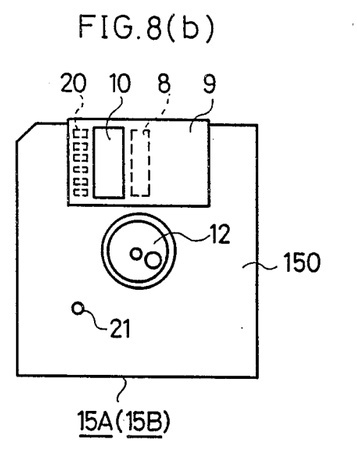
Figure 8C:
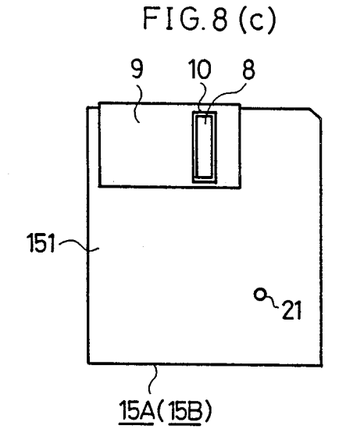
Figure 8D:
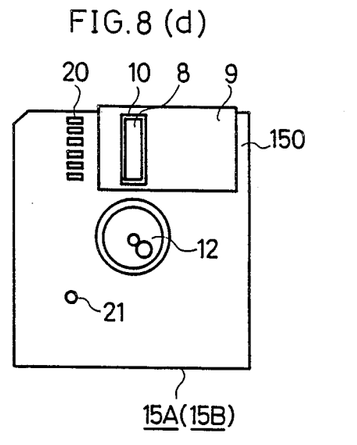

Before the cartridge is inserted, the conductors 20 are covered by the shutter 9 as shown in FIG. 8(b), while after the cartridge is inserted into the drive, the shutter 9 is opened by a shutter opening mechanism (not shown) to expose the conductors 20 for an electrical connection with the disk device 1A. The presence of the discrimination hole 21 allows the discrimination circuit 17 to recognize that the inserted memory medium is a semiconductor memory medium.

Figure 9:
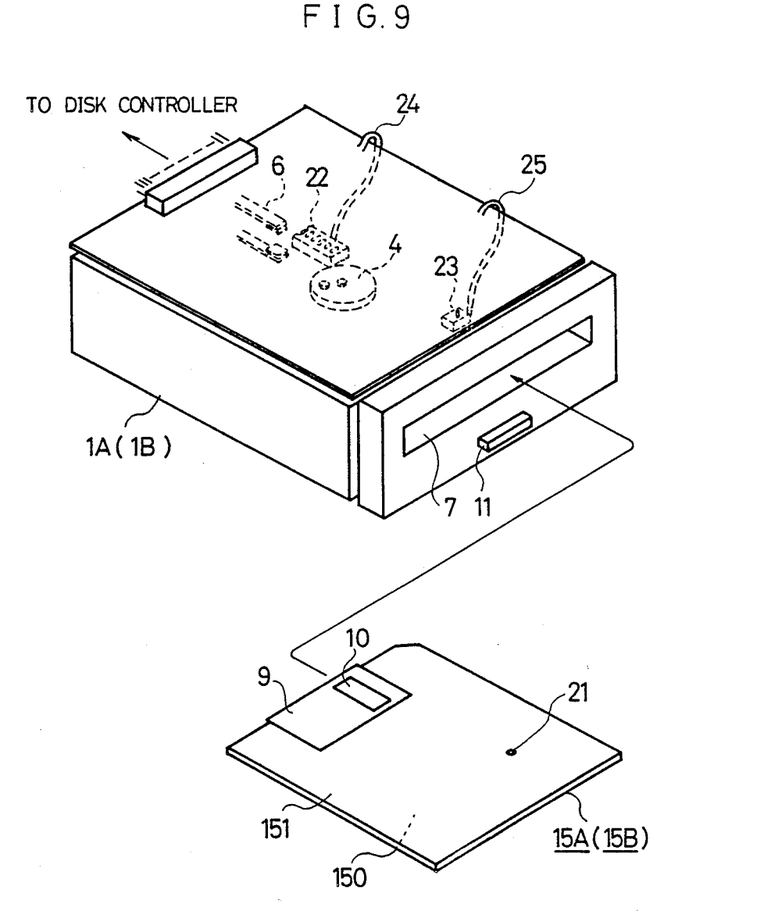
FIG. 9 is a perspective view of a disk device according to an embodiment of the invention.

FIG. 9 shows a disk device according to an embodiment of the invention. The disk device includes a chucking hub 4 capable of holding either a disk sheet 2 (not shown) or a semiconductor cartridge 15A (or 15B), a magnetic head 6 for the disk sheet 2, a slot 7 constituting a memory medium holding device in cooperation with the chucking hub 4 for holding either the disk sheet 2 or the semiconductor cartridge 15A, a connector 22 for making an electrical connection with the semiconductor cartridge 15A, a hole sensor 23, a component of the discrimination device, for detecting the discrimination hole 21 of the semiconductor cartridge 15A, a signal cable 24 for connecting the connector 22 with a semiconductor memory medium control circuit 16 of the disk device 1A or a switching circuit 18 of the disk device 1B, and a signal cable 25 for connecting the hole sensor 23 with the discrimination circuit 17.

Figure 10A:
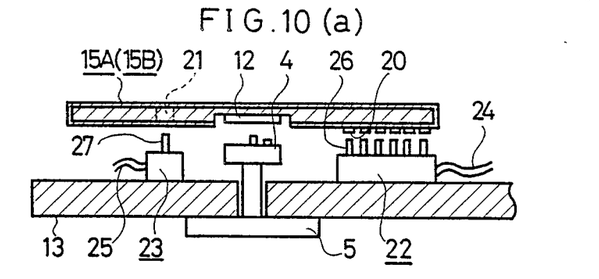
FIGS. 10(a) and 10(b) are sectional views of the disk device of FIG. 9 before and after the semiconductor cartridge is inserted into the disk device, respectively.
Figure 10B:
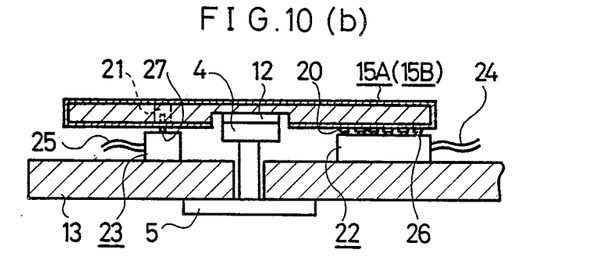

FIGS. 10(a) and 10(b) show how the semiconductor cartridge 15A (or 15B) is mounted within the disk device. A number of contacts 26 are provided on the connector 22. When a detecting bar 27 is depressed into the hole sensor 23, the hole sensor 23 recognizes that the inserted memory medium is not a semiconductor memory medium. The semiconductor cartridge 15A (or 15B) has a pair surfaces 150 (side 0) and 151 (side 1). When the semiconductor cartridge 15A is inserted into the device, the contacts 26 come into contact with the conductors 20 to complete an electrical connection between the semiconductor cartridge 15A and the disk device 1A. The detecting bar 27 is received by the discrimination hole 21 so that the inserted memory medium is recognized as a semiconductor memory medium.

Figure 11A:
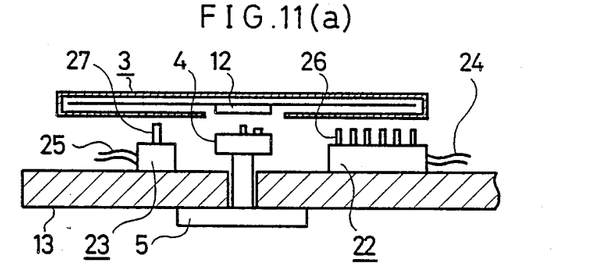
FIGS. 11(a) and 11(b) are sectional views similar to those of FIGS. 10(a) and 10(b)
Figure 11B:
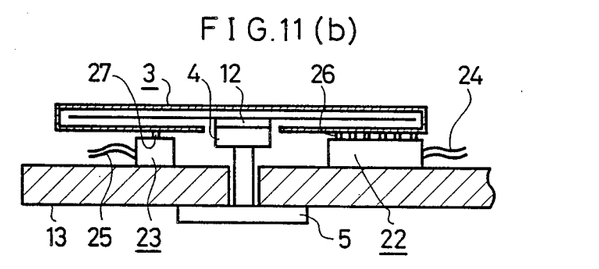

FIGS. 11(a) and 11(b) show how the disk cartridge 3 is mounted within the disk device. The detecting bar 27 is depressed into the hole sensor 23 by the disk cartridge 3 so that the hole sensor 23 recognizes that the inserted memory medium is not a semiconductor memory medium but a disk memory medium.

Figure 12:
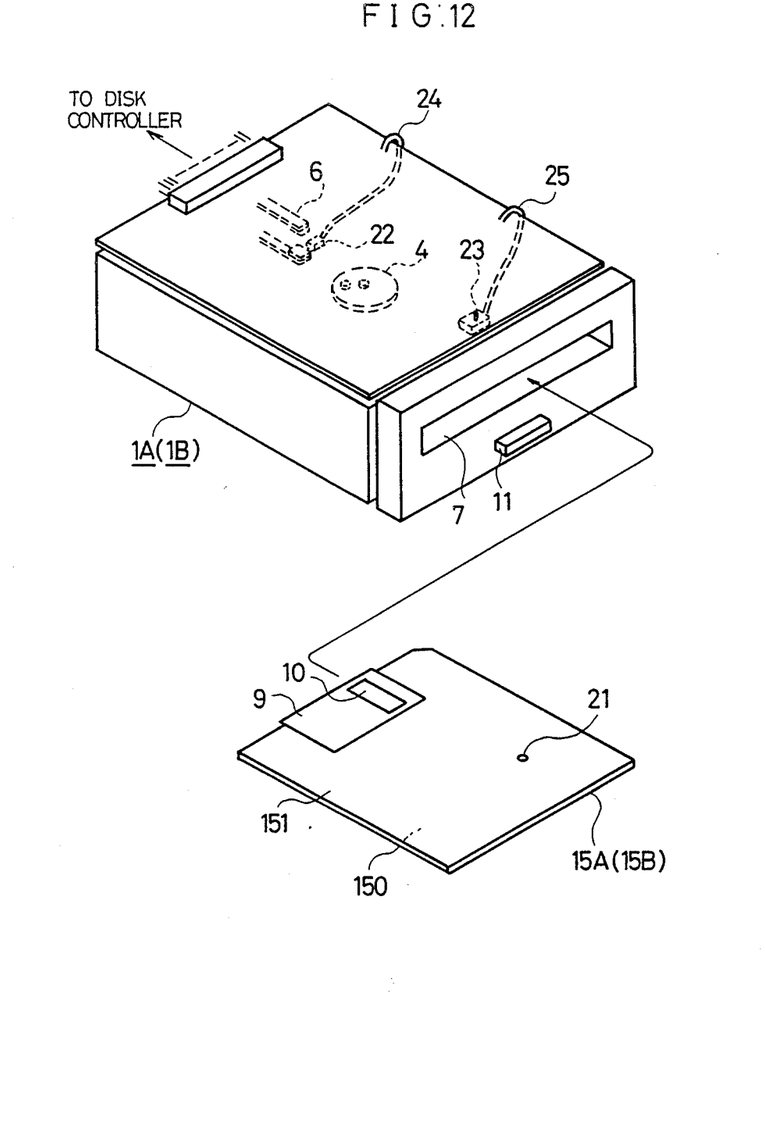
FIG. 12 is a perspective view of a disk device according to another embodiment of the invention.

FIG. 12 shows a disk device according to another embodiment of the invention. The connector 22 is disposed so as to make a connection with a connector provided on a leading sidewall of the semiconductor cartridge 15A (or 15B).

Figure 13:
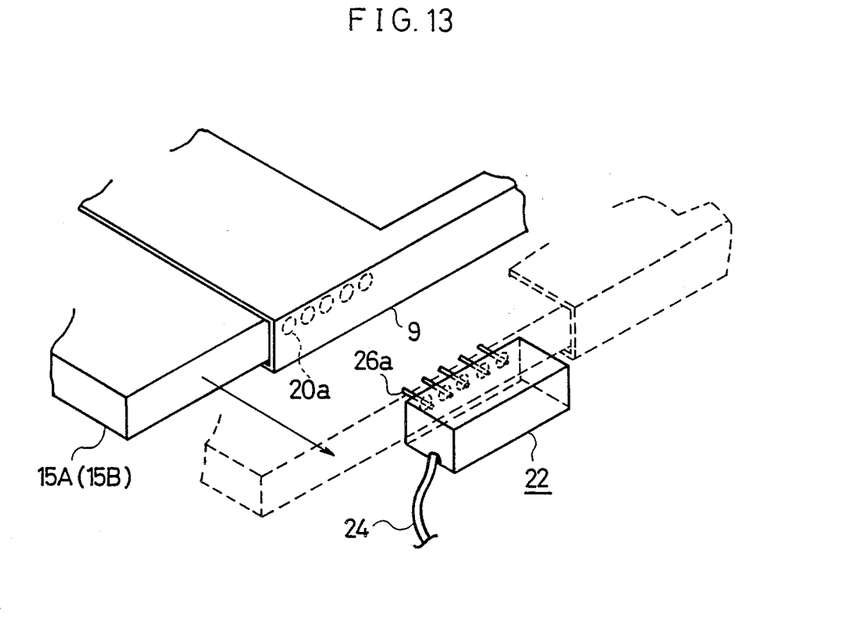
FIG. 13 is an enlarged perspective view of a connector section of the disk device of FIG. 12.

FIG. 13 shows in more detail the connection section of the semiconductor cartridge 15A (or 15B) of FIG. 12. When the semiconductor cartridge 15A is inserted through the slot 7, the shutter 9 is opened by the shutter opening mechanism, allowing each connector receptacle 20a to receive each contact 26a for making electrical connection. The connector 20 is fixed on the base 13 with a spring member (not shown) so that when the disk cartridge 3 is inserted into the device, the connector 26 does not make any electrical connection but a mechanical connection with the disk cartridge 3 and 22 yields backward as the disk cartridge 3 is further inserted.

Figure 14:
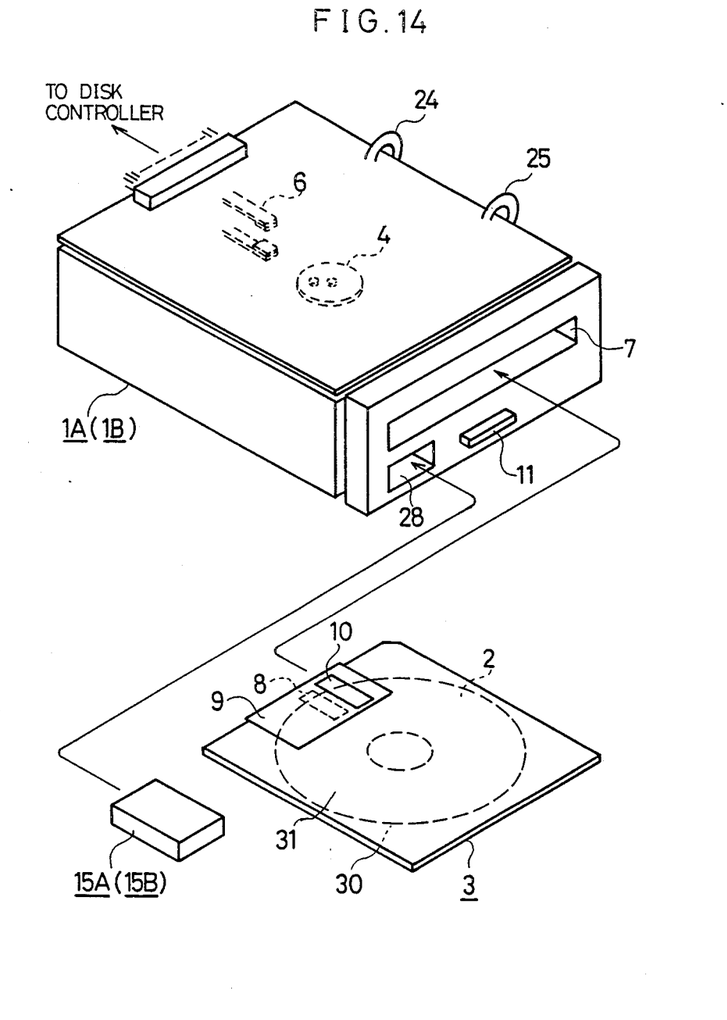
FIG. 14 is a perspective view of a disk device according to still another embodiment of the invention.

FIG. 14 shows a disk device according to still another embodiment of the invention. This disk device has a small slot 28 adjacent the slot 7 for receiving a semiconductor cartridge 15A (or 15B). The discrimination between the semiconductor cartridge 15A and the disk cartridge 3 may be effected by detecting either the discrimination device provided on the semiconductor cartridge 15A (with the discrimination circuit) or the presence of a memory medium in the small slot 28.

Figure 15:
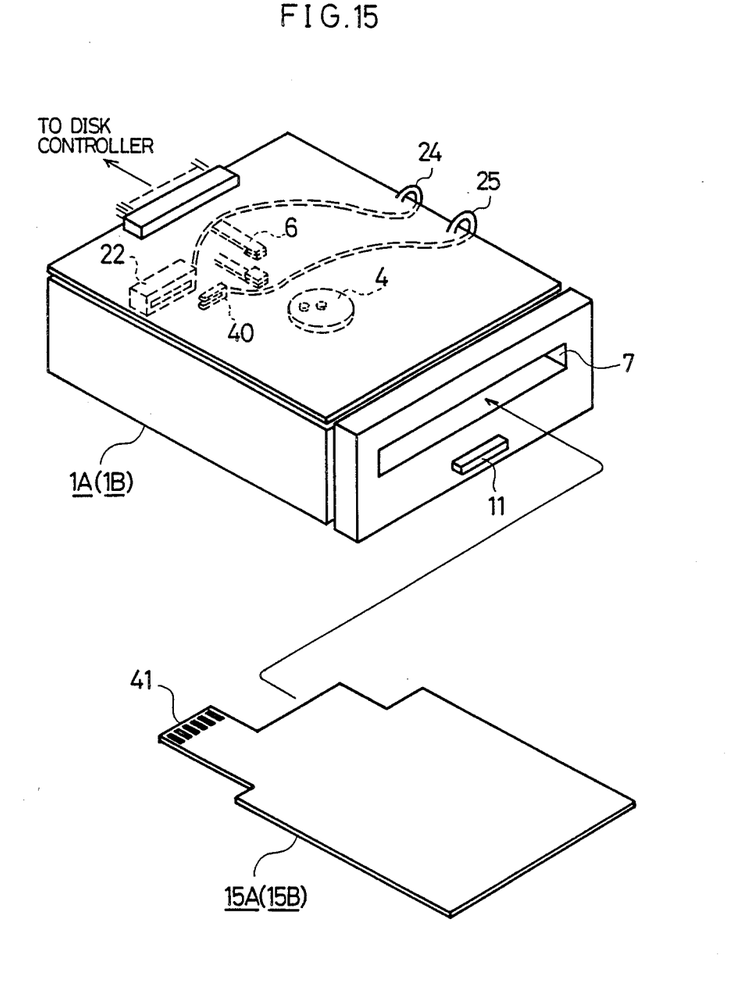
FIG. 15 is a perspective view of a disk device according to yet another embodiment of the invention.

FIG. 15 shows a disk device according to yet another embodiment of the invention. This disk device has a shape sensor 40 for detecting the shape of a semiconductor cartridge 15A (or 15B). The shape of a semiconductor cartridge 15A is made different from that of a disk cartridge 3. This semiconductor cartridge is shaped so as to inhibit any operation of the shutter opening and disk cartridge loading mechanisms in the disk device 1A (or 1B) and has at its leading edge a card edge connector 41, which is plugged into the connector 22 of the disk device 1A for making an electrical connection. The insertion of a semiconductor cartridge 15A is detected by the fact that the shape sensor 40 detects the card edge connector 41 which the disk cartridge 3 lacks.

Figure 16:
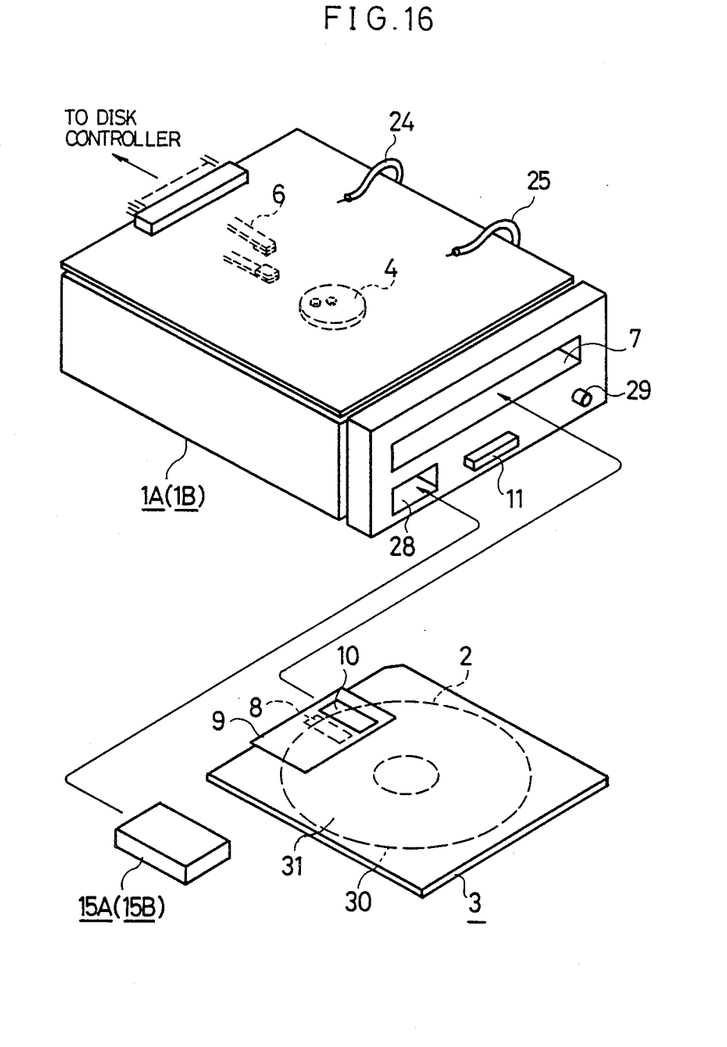
FIG. 16 is a perspective view of a disk device according to an embodiment of the invention.
Figure 17:
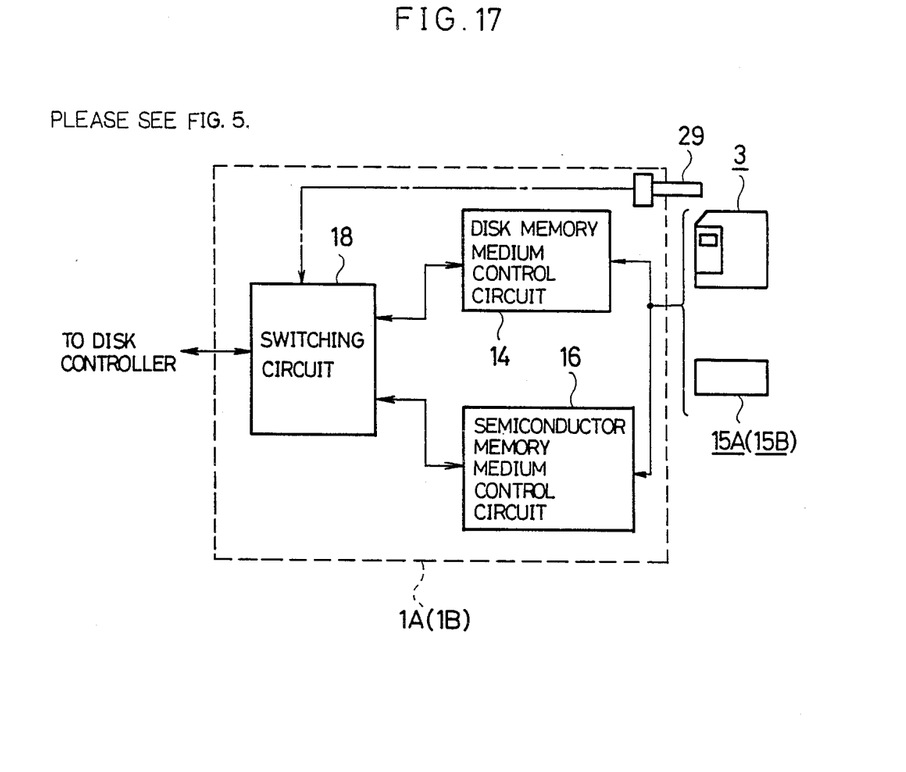
FIG. 17 is a block diagram of the disk device of FIG. 16.

FIGS. 16 and 17 show a disk drive according to another embodiment of the invention. This disk device has on its front panel a mode switch 29 for instructing the type of a memory medium to be used. The semiconductor cartridge 15A inserted through the small slot 28 and the disk cartridge 3 inserted through the slot 7 may be selected for operation by means of the mode switch 27. With the mode switch 27, it is possible to control the switching circuit 18 directly from the outside. For example, when the semiconductor cartridge 15A is used, the mode switch 29 is turned on (state 1) while when the disk cartridge 3 is used, the mode switch 29 is turned off (state 2). The mode switch 28 may take any form as long as the switching circuit 18 is switched between two different states. The semiconductor memory medium control circuit 16 may be embedded or integrally formed on the semiconductor cartridge 15B as shown in FIG. 7.

The signal line electrically connected to the semiconductor cartridge 15A (or 15B) may be used to recognize the semiconductor cartridge. The invention may be applied to other memory devices, such as rigid magnetic, optical, and optomagnetic disk devices, all of which access information mechanically. The invention is further applicable to semiconductor cartridges having a battery for retaining the stored information.

As has been described above, the disk device according to the invention is able to access either the disk memory medium or the semiconductor memory medium which is statically and instantly accessible without any mechanical movement so that is is useful for any system requiring a short access time.

INDUSTRIAL UTILITY

The disk device according to the invention is able to access not only the disk memory medium but also the semiconductor memory medium so that it is very useful for office automation equipment such as word processors and personal computers.

What is claimed is:

1. A memory device comprising:
   memory medium holding means for holding either a disk cartridge housing a disk memory medium which is mechanically accessible or a semiconductor cartridge housing a semiconductor memory medium which is statically accessible;
   a disk memory medium control circuit for controlling said disk memory medium;
   a semiconductor memory medium control circuit for controlling said semiconductor memory medium;
   discrimination means for discriminating the type of a memory medium of an inserted cartridge; and
   a switching circuit responsive to an output of said discrimination means to select either said disk memory medium control circuit or the semiconductor memory medium control circuit.

2. The memory device of claim 1, wherein said semiconductor memory medium control circuit is housed within said semiconductor cartridge.

3. The memory device of claim 1, wherein said memory medium holding means has a slot through which either said disk cartridge or said semiconductor cartridge may be inserted.

4. The memory device of claim 1, wherein said memory medium holding means has a pair of slots through which said disk and semiconductor cartridges are inserted, respectively.

5. The memory device of claim 1, wherein said semiconductor and disk cartridges are identical in shape.

6. The memory device of claim 1, wherein said semiconductor and disk cartridges are different in shape.

7. The memory device of claim 1, wherein said memory medium holding means comprises a connector for electrical connection with at least one conductor provided on said semiconductor cartridge.

8. The memory device of claim 1, wherein said memory medium holding means comprises a first connector for electrical connection with a second connector mounted on said semiconductor cartridge.

9. The memory device of claim 1, wherein said discrimination means comprises a hole sensor for detecting a discrimination hole provided on said semiconductor cartridge.

10. The memory device of claim 1, wherein said discrimination means comprises a shape sensor for detecting a shape of said semiconductor cartridge.

11. A memory device comprising:
    memory medium holding means for receiving either a disk cartridge housing a disk memory medium which is mechanically accessible or a semiconductor cartridge housing a semiconductor memory medium which is statically accessible;
    a disk memory medium control circuit for controlling said disk memory medium;
    a semiconductor memory medium control circuit for controlling said semiconductor memory medium;
    a switching circuit for switching between said semiconductor and disk memory medium control circuits; and
    selection means for instructing said switching means to select either said disk memory medium control circuit or said semiconductor memory medium control circuit for operation.

12. The memory device of claim 11, wherein said semiconductor memory medium control circuit is formed within said semiconductor cartridge.

* * * * *